(12) United States Patent
Muramatsu et al.

(10) Patent No.: US 8,931,351 B2
(45) Date of Patent: Jan. 13, 2015

(54) BENDING SENSOR

(71) Applicant: Tokai Rubber Industries, Ltd., Aichi-ken (JP)

(72) Inventors: Atsushi Muramatsu, Komaki (JP); Yuuki Saitou, Komaki (JP); Masaru Murayama, Komaki (JP)

(73) Assignee: Sumitomo Riko Company Limited, Aichi (JP)

( * ) Notice: Subject to any disclaimer, the term of this patent is extended or adjusted under 35 U.S.C. 154(b) by 170 days.

(21) Appl. No.: 13/752,794

(22) Filed: Jan. 29, 2013

(65) Prior Publication Data

US 2013/0133435 A1    May 30, 2013

Related U.S. Application Data

(63) Continuation of application No. PCT/JP2011/075344, filed on Nov. 2, 2011.

(30) Foreign Application Priority Data

Nov. 4, 2010 (JP) .................................. 2010-247126

(51) Int. Cl.
*G01L 1/20* (2006.01)
*G01L 1/00* (2006.01)
(Continued)

(52) U.S. Cl.
CPC ... *G01L 1/06* (2013.01); *G01B 1/00* (2013.01); *G01B 7/18* (2013.01); *G01D 5/16* (2013.01); *G01L 1/2287* (2013.01); *H01L 29/84* (2013.01)
USPC .................. 73/849; 73/862.474; 73/862.632; 73/862.621

(58) Field of Classification Search
CPC ........... G01L 1/205; G01L 1/20; G01L 1/146; G01L 5/228; G01L 9/0002
USPC .............. 73/849, 862.451, 862.471, 862.474, 73/862.621–862.627, 862.632, 862.634, 73/862.637, 862.639
See application file for complete search history.

(56) References Cited

U.S. PATENT DOCUMENTS 4,708,896 A * 11/1987 Akao ........................... 428/34.3
5,086,785 A * 2/1992 Gentile et al. ................ 600/595
(Continued)

FOREIGN PATENT DOCUMENTS

JP          62-12825        1/1987
JP          63-052024       3/1988
(Continued)

OTHER PUBLICATIONS

International Search Report, mail date is Jan. 10, 2012.

*Primary Examiner* — Lisa Caputo
*Assistant Examiner* — Jonathan Dunlap
(74) *Attorney, Agent, or Firm* — Greenblum & Bernstein, P.L.C.

(57) ABSTRACT

A bending sensor includes a high resistance layer; a low resistance layer having a crack and a lower electrical resistance than the high resistance layer in a state where the crack is closed; an insulating layer between the high and low resistance layers; and a plurality of electrode portions connecting electrically in parallel the high resistance and low resistance layers. In an OFF state where a bend amount is small, the crack is unlikely to open and a combined resistance of electrical resistances of the high resistance layer and the low resistance layer is output as OFF resistance from the plurality of electrode portions. In an ON state where the bend amount is large, the crack is likely to open and at least the electrical resistance of the high resistance layer is output as ON resistance higher than the OFF resistance from the plurality of electrode portions.

13 Claims, 9 Drawing Sheets

(51) Int. Cl.
*G01L 1/06* (2006.01)
*G01B 1/00* (2006.01)
*G01B 7/16* (2006.01)
*G01D 5/16* (2006.01)
*G01L 1/22* (2006.01)
*H01L 29/84* (2006.01)

(56) References Cited

U.S. PATENT DOCUMENTS

| | | | |
|---|---|---|---|
| 5,583,476 A * | 12/1996 | Langford | 338/211 |
| 5,652,395 A * | 7/1997 | Hirano et al. | 73/849 |
| 5,799,533 A * | 9/1998 | Seki et al. | 73/172 |
| 6,225,583 B1 * | 5/2001 | Shigematsu et al. | 200/61.44 |
| 6,492,475 B1 * | 12/2002 | Egashira et al. | 526/153 |
| 6,874,378 B2 * | 4/2005 | Lautzenhiser et al. | 73/862.627 |
| 7,248,142 B2 * | 7/2007 | Beck et al. | 338/211 |
| 7,472,587 B1 * | 1/2009 | Loehndorf et al. | 73/146 |
| 7,834,527 B2 * | 11/2010 | Alvarez Icaza Rivera et al. | 310/344 |
| 8,272,276 B2 * | 9/2012 | Gorjanc et al. | 73/862.046 |
| 8,511,174 B2 * | 8/2013 | Herrmann et al. | 73/774 |
| 8,770,045 B2 * | 7/2014 | Murayama et al. | 73/862.626 |
| 2004/0007859 A1 | 1/2004 | Shields et al. | |
| 2006/0238291 A1 * | 10/2006 | Beck et al. | 338/200 |
| 2007/0030112 A1 * | 2/2007 | Beck et al. | 338/211 |
| 2008/0066564 A1 | 3/2008 | Hayakawa et al. | |
| 2008/0067477 A1 * | 3/2008 | Hayakawa et al. | 252/511 |
| 2008/0100046 A1 * | 5/2008 | Hayakawa et al. | 280/735 |
| 2009/0015270 A1 * | 1/2009 | Hayakawa et al. | 324/686 |
| 2009/0120696 A1 * | 5/2009 | Hayakawa et al. | 178/18.05 |
| 2009/0151478 A1 * | 6/2009 | Shimomoto et al. | 73/862.626 |
| 2010/0049450 A1 * | 2/2010 | Nagakubo et al. | 702/41 |
| 2011/0307214 A1 * | 12/2011 | Saitou et al. | 702/155 |

FOREIGN PATENT DOCUMENTS

| | | |
|---|---|---|
| JP | 1-233301 | 9/1989 |
| JP | 4-9703 | 1/1992 |
| JP | 5-180859 | 7/1993 |
| JP | 2003-510216 | 3/2003 |
| JP | 2008-70327 | 3/2008 |
| WO | 01/23224 | 4/2001 |

* cited by examiner (a)

(b)

(a)

(b)

BENDING SENSOR

CLAIM OF PRIORITY

This application is a continuation of PCT/JP2011/075344 filed Nov. 2, 2011, and claims the priority benefit of Japanese Application No. 2010-247126, filed Nov. 4, 2010, the contents of which are expressly incorporated by reference in its entirety.

TECHNICAL FIELD

The present invention relates to a bending sensor that detects a bending deformation from a variation in electrical resistance.

BACKGROUND ART

Patent Literature 1 discloses a pressure sensor having a pressure conductive member. The pressure conductive member includes a silicone rubber and metal fine particles. The metal fine particles are dispersed in the silicone rubber. With a load exerted on the pressure sensor, the dispersed metal fine particles approach one another, thus reducing electrical resistance. Accordingly, the pressure conductive member becomes conductive. The pressure sensor of Patent Literature 1 detects the load based on the conduction.

CITATION LIST

Patent Literature

Patent Literature 1: Japanese Patent Laid-Open Publication No. S63-52024
Patent Literature 2: Japanese Patent Application Publication No. 2003-510216

SUMMARY OF INVENTION

Technical Problem

The pressure sensor of Patent Literature 1, however, is low in sensitivity (=variation amount in electrical resistance/deformation amount). In this regard, Patent Literature 2 discloses a shock sensor system having a bending reactance element. The bending reactance element includes a strip. Cracks are scattered about one surface of the strip. With a load exerted on the bending reactance element, the cracks open, thus increasing electrical resistance of the bending reactance element. The shock sensor system of Patent Literature 2 detects a shock based on an increase in the electrical resistance. Thus, the shock sensor system has higher sensitivity than the pressure sensor of Patent Literature 1.

In the shock sensor system of Patent Literature 2, however, the variation amount in the electrical resistance relies on a distribution, degree of opening, and shape of the cracks. Specifically, the variation in the electrical resistance solely relies on a state of the cracks. The state of the cracks is likely to vary among a plurality of strips. Thus, the sensitivity is likely to vary among a plurality of strips in the shock sensor system of Patent Literature 2. This requires individual adjustment of the sensitivity of strips at activation of the shock sensor system.

In view of the circumstances above, a bending sensor according to the present invention has been perfected. An object of the present invention is to provide a bending sensor having high sensitivity and a limited variation in sensitivity.

Solution to Problem (1) In order to address the circumstances above, a bending sensor according to the present invention includes a high resistance layer including a parent material composed of one of a resin and an elastomer and a conductive filler dispersed in the parent material; a low resistance layer including a parent material composed of one of a resin and an elastomer, a conductive filler dispersed in the parent material, a tensile surface receiving tensile stress during bending deformation, and a crack having an opening on the tensile surface and developing in a laminating direction, the low resistance layer having lower electrical resistance than the high resistance layer in a state where the crack is closed; an insulating layer including at least the parent material from among the parent material composed of one of the resin and the elastomer, and an insulation filler dispersed in the parent material, the insulating layer being disposed between the high resistance layer and the low resistance layer and electrically insulating the high resistance layer from the low resistance layer; and a plurality of electrode portions connecting electrically in parallel the high resistance layer and the low resistance layer. In an OFF state where a bend amount is small, the crack is unlikely to open and a combined resistance of an electrical resistance of the high resistance layer and an electrical resistance of the low resistance layer is output as OFF resistance from the plurality of electrode portions. In an ON state where the bend amount is larger than that in the OFF state, the crack is more likely to open than in the OFF state, and, of the electrical resistance of the high resistance layer and the electrical resistance of the low resistance layer, at least the electrical resistance of the high resistance layer is output as ON resistance higher than the OFF resistance from the plurality of electrode portions.

The bending sensor according to the present invention includes the high resistance layer, the low resistance layer, the insulating layer, and the plurality of electrode portions. The crack is formed in the low resistance layer. The high resistance layer and the low resistance layer are connected in parallel to the plurality of electrode portions with the insulating portion therebetween.

In the OFF state, the crack in the low resistance layer is unlikely to open. In a case where a plurality of cracks is provided, for instance, a proportion of open cracks to all cracks is small. In addition, a degree of opening of the cracks in the open state is small. Thus, the combined resistance of the electrical resistance of the high resistance layer and the electrical resistance of the low resistance layer is output as the OFF resistance from the plurality of electrode portions.

In contrast, the cracks are likely to open in the ON state. In a case where a plurality of cracks is provided, for instance, a proportion of open cracks to all cracks is large. In addition, a degree of opening of the cracks in the open state is large. Thus, at least the electrical resistance of the high resistance layer is output as the ON resistance from the plurality of electrode portions.

According to the bending sensor of the present invention, the electrical resistance varies mainly depending on opening and closing of the cracks. Thus, the sensitivity (=variation amount in electrical resistance/deformation amount) is high compared to a bending sensor that only has a resistance layer with no cracks, such as the pressure sensor of Patent Literature 1. This makes it easy to determine the OFF state and the ON state.

The OFF resistance is the combined resistance of the electrical resistance of the high resistance layer and the electrical resistance of the low resistance layer. The ON resistance is at least the electrical resistance of the high resistance layer. Thus, the OFF resistance and the ON resistance are unlikely to vary, making it easy to determine the OFF state and the ON state.

The electrical resistance mainly depends on the state of the cracks (distribution, degree of opening, shape, and the like of the cracks) in the low resistance layer in contrast with the high resistance layer. Thus, the electrical resistance and the sensitivity are less likely to vary in the high resistance layer than in the low resistance layer.

In this regard, the low resistance layer and the high resistance layer are connected electrically in parallel in the bending sensor of the present invention. Specifically, both the OFF resistance and the ON resistance output from the bending sensor include the electrical resistance of the high resistance layer. Thus, a variation in electrical resistance attributable to the state of the cracks in the low resistance layer is unlikely to be reflected in the OFF resistance and the ON resistance. Unlike a bending sensor, such as the shock sensor system of Patent Literature 2, which only has a resistance layer having cracks, the electrical resistance (OFF resistance and ON resistance) is unlikely to vary. Furthermore, the sensitivity is unlikely to vary.

In addition, in a case of a bending sensor that only has a resistance layer having cracks, such as the shock sensor system of Patent Literature 2, when the cracks are opened and the electrical resistance increases substantially, determining whether a sensor is responding or is disconnected (malfunctioning) is difficult. Thus, a threshold to distinguish response from the sensor and disconnection of the sensor should be defined at a relatively high level. For example, the threshold should be defined at a level of the electrical resistance of the high resistance layer of the bending sensor of the present invention.

In contrast, the low resistance layer and the high resistance layer are connected electrically in parallel in the bending sensor of the present invention. Thus, the electrical resistance is unlikely to increase substantially even with the cracks open in the low resistance layer. A threshold to distinguish the OFF state and the ON state can thus be defined between the OFF resistance and the ON resistance. In addition, a threshold to distinguish the ON state and the disconnected state can be defined at a value higher than the ON resistance. Accordingly, the bending sensor of the present invention can determine the OFF state, the ON state, and the disconnected state. The bending sensor that only has the resistance layer having cracks is highly likely to erroneously determine as the OFF state. Alternatively, the ON state is highly likely to be erroneously determined as the disconnected state.

In the bending sensor of the present invention, the electrical resistance varies mainly depending on opening of the cracks. Compared to a case where the electrical resistance varies only depending on elastic deformation of a parent material, even a small deformation can be detected at high accuracy.

Furthermore, a speed of elastic deformation of the parent material is affected by ambient temperature. In this regard, the electrical resistance of the bending sensor of the present invention is disconnected mainly in accordance with opening of the cracks. Compared to the case where the electrical resistance varies only depending on the elastic deformation of the parent material, a response speed is less dependent on ambient temperature.

The cracks are formed in advance in the low resistance layer. Thus, a new crack is unlikely to be formed during bending deformation. Accordingly, the sensitivity of the bending sensor is unlikely to vary. In addition, the conductive filler is dispersed in the parent material of the low resistance layer of the bending sensor of the present invention. Thus, the cracks are likely to be formed along a surface of the conductive filler. Furthermore, the cracks tend to develop along the surface of the conductive filler, thus reducing breaking strain of the low resistance layer. The electrical resistance is unlikely to increase in the OFF state. A contact state of the conductive filler is easily changed when switching from the OFF state to the ON state. The thickness of the low resistance layer is readily reduced.

The insulating layer is disposed between the high resistance layer and the low resistance layer. This ensures electrical disconnection between the high resistance layer and the low resistance layer. In a case where an insulation filler is included in the insulating layer, the cracks are readily formed in the low resistance layer.

(1-1) In the configuration according to (1) above, the conductive filler in the low resistance layer preferably has a spherical shape and is filled in the parent material in substantially a single particle state at a high filling rate. The term "substantially a single particle state" herein means that 50 mass % or more relative to a total weight of the conductive filler of 100 mass % is present in a state of single primary particles, not aggregated secondary particles. The "high filling rate" means that the conductive filler is mixed in at approximately the most tightly filled state. The "spherical shape" includes a perfect spherical shape and substantially a perfect spherical shape, as well as an oval spherical shape, an oblong spherical shape (shape formed of a pair of opposing hemispheres connected by a column), a partial spherical shape, a spherical shape having different radii portion by portion, and a water droplet shape. According to the present configuration, the electrical resistance tends to increase when switching from the OFF state to the ON state. This improves the sensitivity of the bending sensor.

(1-2) In the configuration according to (1) above, in a case where a plurality of unit sections each having a length of 2 mm or less is provided continuously in a placement direction of the plurality of electrode portions in the low resistance layer, at least one crack is preferably formed in the unit section.

The sensitivity of the bending sensor depends on the density of the cracks formed in the low resistance layer (the number of cracks per unit length in the placement direction of the plurality of electrode portions). The length of the unit section is defined at 2 mm or less because the density of cracks is reduced when greater than 2 mm, reducing the sensitivity of the bending sensor. In other words, desired sensitivity is difficult to achieve. The length of the unit section is more preferably defined at 1 mm or less. This further improves the sensitivity of the bending sensor.

(2) In the configuration according to (1) above, the crack is preferably configured to pass through the low resistance layer in the laminating direction and reach the insulating layer. According to the present configuration, the crack tends to open, thus increasing the sensitivity. The sensitivity is also less likely to vary.

(3) In the configuration according to (1) or (2) above, the opening is preferably configured to disconnect the tensile surface in a direction orthogonal to a placement direction of the plurality of electrode portions. According to the present configuration, the crack tends to open, thus increasing the sensitivity. The sensitivity is also less likely to vary.

In a combination of the present configuration and the configuration of (2) above, when switching from the OFF state to the ON state, the crack opens to completely electrically disconnect the low resistance layer. Thus, only the electrical resistance of the high resistance layer is provided as the ON resistance, increasing a difference between the OFF resistance and the ON resistance. Accordingly, the OFF state or the ON state is readily determined. Furthermore, the sensitivity is less likely to vary.

(4) In the configuration according to one of (1) to (3) above, the insulating layer is preferably configured to be laminated on a load output side of the high resistance layer and the low resistance layer is preferably configured to be laminated on a load output side of the insulating layer. The bending sensor is preferably configured to further include an elastically deformable covering layer disposed on the load output side of the low resistance layer and covering the opening and a base material disposed on the load input side of the high resistance layer and having the high resistance layer fixed thereto.

According to the present configuration, the base material, the high resistance layer, the insulating layer, the low resistance layer, and the covering layer are disposed in this sequence from the load input side to the load output side (though another member may be disposed between the adjacent layers).

In the present configuration, the high resistance layer and the low resistance layer are laminated on the base material. Thus, the high resistance layer and the low resistance layer are likely to be induced to bend and deform in the ON state. In addition, the tensile surface of the low resistance layer is covered by the covering layer in the present configuration. This inhibits degradation of the low resistance layer. Furthermore, the covering layer is elastically deformable. When switching from the ON state to the OFF state, an elastic restoration force of the covering layer thus assists the low resistance layer to readily restore an original shape thereof. The opened crack also readily closes.

The high resistance layer and the low resistance layer are laminated on the base material. The thickness of the base material in the load input/output direction can be adjusted to control the sensitivity of the bending sensor. For example, increasing the thickness of the base material in the load input/output direction increases deformation amounts of the high resistance layer and the low resistance layer when switching from the OFF state to the ON state. This improves the sensitivity of the bending sensor.

(5) In the configuration according to (4) above, the plurality of electrode portions, the high resistance layer, the insulating layer, the low resistance layer, and the covering layer are preferably configured to be laminated and printed on the base material. According to the present configuration, the thickness of each layer can be readily reduced. This reduces the thickness of the bending sensor and increases dimension accuracy of each layer.

(6) In the configuration according to (1) above, the bending sensor is preferably configured to further include a reinforcement layer provided between the high resistance layer and the insulating layer and inhibiting the crack from developing deeper than the insulating layer. For example, the reinforcement layer is more flexible than the insulating layer. Specifically, the reinforcement layer has a lower Young's modulus than the insulating layer. Furthermore, the reinforcement layer has a higher tensile fracture strain in JIS K7161. According to the present configuration, the crack is unlikely to enter the reinforcement layer and thus is inhibited from entering the high resistance layer.

(7) In the configuration according to (6) above, the reinforcement layer is preferably configured to have the insulating layer and the low resistance layer laminated and printed on a surface of a load output side and have the high resistance layer printed on a surface of a load input side.

According the present configuration, the low resistance layer and the insulating layer are disposed separately from the high resistance layer with the base material therebetween. This inhibits the crack from entering the high resistance layer. According to the present configuration, the thickness of each layer can be readily reduced. This reduces the thickness of the bending sensor and increases dimension accuracy of each layer.

(8) In the configuration according to (1) above, the high resistance layer and the low resistance layer are preferably configured to be disposed so as not to overlap when viewed from the load input side or the load output side. According to the present configuration, the high resistance layer and the low resistance layer are not adjacently provided in the load input direction. This inhibits the crack from entering the high resistance layer.

(9) In the configuration according to (1) above, the high resistance layer is preferably configured to have a cross-sectional area smaller than the low resistance layer in the direction orthogonal to the placement direction of the plurality of electrode portions.

A conductive path is formed between the plurality of electrode portions. In the present configuration, the conductive path has a smaller cross-sectional area in the high resistance layer than in the low resistance layer. Thus, the electrical resistance of the high resistance layer can be readily provided higher than the electrical resistance of the low resistance layer.

In a combination of the present configuration and the configuration of (5) above, a print pattern of the high resistance layer and a print pattern of the low resistance layer can be devised to readily define the electrical resistances of the high resistance layer and of the low resistance layer.

(10) In the configuration according to (1) above, the high resistance layer is preferably configured to have higher volume resistivity than the low resistance layer. According to the present configuration, the volume resistivity can be adjusted to set a difference in the electrical resistance between the high resistance layer and the low resistance layer.

(11) In the configuration according to (10) above, a difference in the volume resistivity is preferably configured to be created between the high resistance layer and the low resistance layer by adjusting filling rates of the conductive filler for the high resistance layer and the low resistance layer. According to the present configuration, a difference in the electrical resistance can be readily created between the high resistance layer and the low resistance layer without adjusting quality of the parent material (though the quality may be adjusted).

(12) In the configuration according to one of (1) to (11) above, the bending sensor is preferably configured to further include a plurality of divided bodies of a sensor including a divided body of a high resistance layer as a portion of the high resistance layer, a divided body of a low resistance layer as a portion of the low resistance layer, a divided body of an insulating layer as a portion of the insulating layer, and the plurality of electrode portions connecting electrically in parallel the divided body of the high resistance layer and the divided body of the low resistance layer. The plurality of divided bodies of the sensor is preferably configured to be linearly disposed.

The term "linearly" herein refers to a straight line, a curved line, a combination of straight lines (polygonal line), a combination of curved lines (e.g., a C-shape, an S-shape, and a wavy line; sizes and directions of curvature radii for a plurality of curved lines may be consistent or different), or a combination of a straight line and a curved line. In addition, the term "linearly" includes a state where the plurality of divided bodies of the sensor are connected (solid line shape) and a state where the plurality of divided bodies of the sensor are disconnected (dotted line or dashed-dotted line).

According to the present configuration, a section for measuring electrical resistance is short compared to a bending sensor having a single high resistance layer, a single low resistance layer, and a pair of electrode portions at ends of the high resistance layer and the low resistance layer. This reduces a measurement error attributable to specific resistances of the divided body of the high resistance layer and the divided body of the low resistance layer, allowing highly accurate detection even of a small deformation.

(13) In the configuration according to (12) above, a combined resistance of an electrical resistance of the divided body of the high resistance layer and an electrical resistance of the divided body of the low resistance layer is preferably configured to be 10 kΩ or less in any divided body of the sensor in the OFF state.

The combined resistance is defined at 10 kΩ or less because the measurement error attributable to the specific resistances of the divided body of the high resistance layer and the divided body of the low resistance layer is great in a case of more than 10 kΩ. According to the present configuration, even a small deformation can be detected at high accuracy.

Advantageous Effects of Invention

The present invention provides a bending sensor having high sensitivity and a limited variation in sensitivity.

REFERENCE SIGNS LIST

Figure 1:
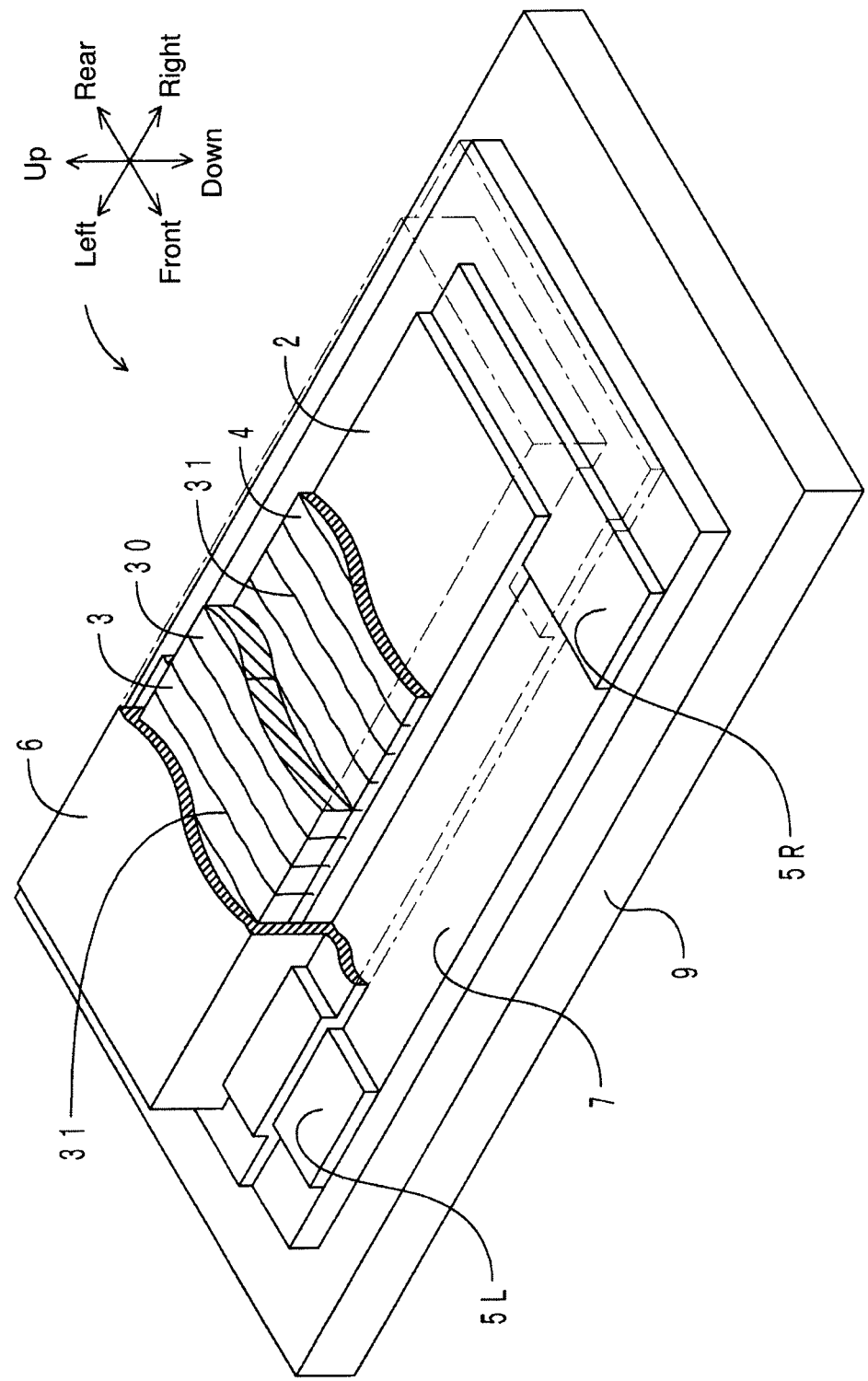
FIG. 1 is a transparent perspective view of a bending sensor according to a first embodiment.

1: Bending sensor; 1a-1c: Divided body of sensor; 1a: Sensor precursor; 2: High resistance layer; 2a: Front portion; 2b: Central portion; 2c: Rear portion; 2α: Coating material for high resistance layer; 3: Low resistance layer; 3α: Coating material for low resistance layer; 4: Insulating layer; 4α: Coating material for insulating layer; α: Electrode portion; 5Lα: Coating material for electrode portion; 5R: Electrode portion; 5a-5d: Electrode portion; 5Rα: Coating material for electrode portion; 6: Covering layer; 6α: Coating material for covering layer; 7: Base material; 9: Mounted member 30: Tensile surface; 31: Crack; 32: Epoxy resin (parent material); 33: Carbon beads (conductive filler); 50L: Electrode portion; 50R: Electrode portion; 80: Crack forming mold; 81: Controller; 90: Coated layer; 91: Reinforcement layer;

310: Opening; 311: End; 800: Mold surface

O: Colliding object; P: Conductive path; RH: Electrical resistance; RL: Electrical resistance; Roff: OFF resistance; Ron: ON resistance; Rout: Electrical resistance; Soff: OFF state; Son: ON State; U: Unit section; p: Divided body of conductive path

DESCRIPTION OF EMBODIMENTS

Embodiments of a bending sensor according to the present invention are described below.

First Embodiment

For ease of description, a length in a left-right direction is decreased and a length in an up-down direction (thickness) is increased relative to actual dimensions of a bending sensor in the drawings referred to below. In the drawings, the left-right direction corresponds to a "placement direction of a plurality of electrode portions" of the present invention. A front-rear direction corresponds to a "direction orthogonal to the placement direction of the plurality of electrode portions" of the present invention. The up-down direction corresponds to a "laminating direction" of the present invention. An upper side corresponds to a "load output side" of the present invention. A lower side corresponds to a "load input side" of the present invention.

Figure 2:
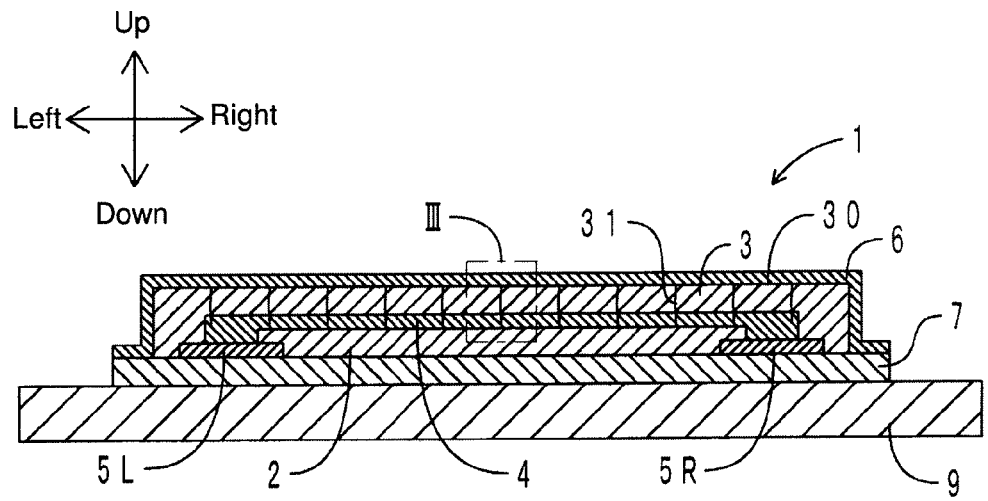
FIG. 2 is a cross-sectional view in a left-right direction of the bending sensor.
Figure 3:
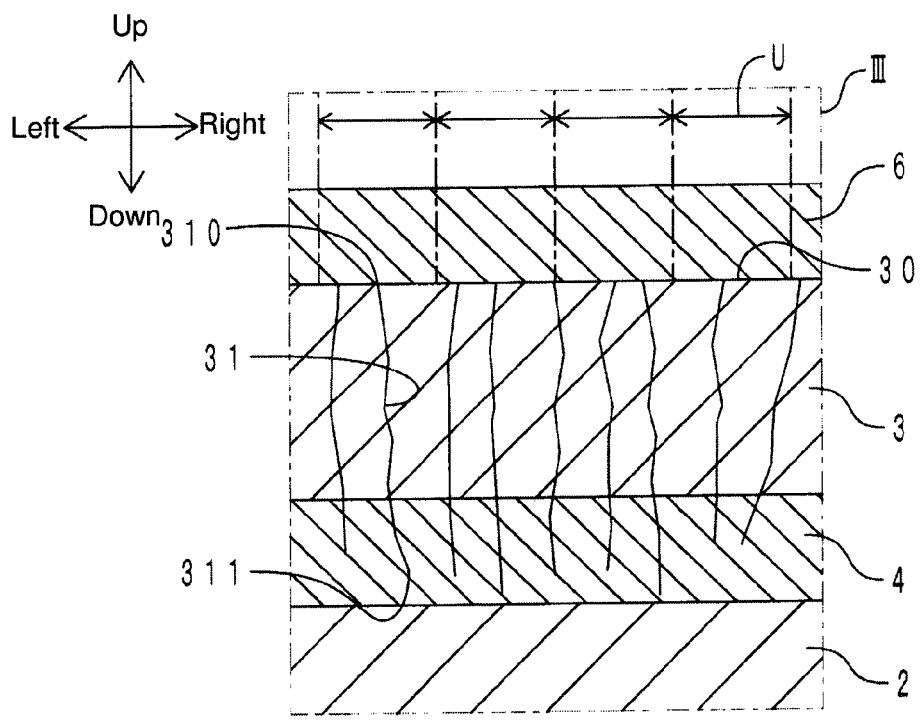
FIG. 3 is an enlarged view of a portion in a frame III of FIG. 2.

FIG. 1 is a transparent perspective view of the bending sensor according to the present embodiment. FIG. 2 is a cross-sectional view in the left-right direction of the bending sensor. FIG. 3 is an enlarged view of a portion in a frame III of FIG. 2. With reference to FIGS. 1 to 3, a bending sensor 1 has a high resistance layer 2, a low resistance layer 3, an insulating layer 4, a pair of electrode portions 5L and 5R, a covering layer 6, and a base material 7.

The base material 7 is composed of polyimide (PI) and has a band shape extending in the left-right direction. The base material 7 is fixed to an upper surface of a mounted member 9. The electrode portions 5L and 5R each have a strip shape extending in the front-rear direction. The electrode portion 5L is disposed proximate to a left end of an upper surface of the base material 7. The electrode portion 5R is disposed proximate to a right end of the upper surface of the base material 7. The electrode portions 5L and 5R are connected to a controller (not shown in the drawings).

The high resistance layer 2 has a band shape extending in the left-right direction. The high resistance layer 2 is disposed on the upper surface of the base material 7. A left end of the high resistance layer 2 covers the right end of the electrode portion 5L. A right end of the high resistance layer 2 covers the left end of the electrode portion 5R.

The high resistance layer 2 includes an unsaturated polyester resin and numerous conductive carbon fine particles having a size of 50 nm or less. The unsaturated polyester resin is included in a concept of a "parent material" of the present invention. The conductive carbon fine particles are included in a concept of a "conductive filler" of the present invention. The numerous conductive carbon fine particles are filled in the unsaturated polyester resin. The numerous conductive carbon fine particles are filled in the unsaturated polyester resin in a state of chain aggregation.

The insulating layer 4 has a band shape extending in the left-right direction. The insulating layer 4 is disposed on an upper surface of the high resistance layer 2. A left end of the insulating layer 4 covers a central portion in the left-right direction of the electrode portion 5L. A right end of the insulating layer 4 covers a central portion in the left-right direction of the electrode portion 5R.

The insulating layer 4 includes an epoxy resin and numerous silica spherical particles. The epoxy resin is included in the concept of the "parent material" of the present invention. The silica spherical particles are included in the concept of the "insulation filler" of the present invention. The numerous silica spherical particles are filled in the epoxy resin.

The low resistance layer 3 has a band shape extending in the left-right direction. The low resistance layer 3 is disposed on an upper surface of the insulating layer 4. A left end of the low resistance layer 3 covers a left end of the electrode portion 5L. A right end of the low resistance layer 3 covers a right end of the electrode portion 5R.

The low resistance layer 3 includes an epoxy resin and numerous carbon beads. The epoxy resin is included in the concept of the "parent material" of the present invention. The carbon beads are included in the concept of the "conductive filler" of the present invention. The numerous carbon beads are filled in the epoxy resin. A filling rate of the carbon beads is approximately 45 volume % in a case where the volume of the low resistance layer 3 is 100 volume %. The numerous carbon beads are filled in the epoxy resin in substantially a single particle state at a high filling rate. Specifically, 50 mass % or greater of the carbon beads relative to a total weight thereof of 100 mass % is present in a state of single primary particles, not aggregated secondary particles. Furthermore, the carbon beads are mixed in at approximately the most tightly filled state.

With reference to FIG. 3, an upper surface of the low resistance layer 3 is a tensile surface 30. With a load applied from below, a tensile stress is exerted on the tensile surface 30. Numerous cracks 31 that develop downward are formed in advance in the tensile surface 30. Approximately two cracks 31 are formed in a unit section U having a length of 1 mm. The unit sections U are provided continuously in the left-right direction of the low resistance layer 3.

An opening 310 of the crack 31 is formed in the tensile surface 30. The opening 310 has a linear shape extending in the front-rear direction. The opening 310 disconnects the tensile surface 30 in the front-rear direction. In a state where the crack 31 is closed, a left wall and a right wall of the crack 31 are in contact with each other. An end 311 of the crack 31 passes through the low resistance layer 3 in the up-down direction and reaches an interior of the insulating layer 4. With the crack 31 changing from the closed state to an open state, the left wall and the right wall of the crack 31 are entirely disengaged in the low resistance layer 3. Thus, the low resistance layer 3 is disconnected in the left-right direction.

The covering layer 6 is composed of an acrylic rubber and has a band shape extending in the left-right direction. The covering layer 6 covers from above the base material 7, the pair of electrode portions 5L and 5R, the high resistance layer 2, the insulating layer 4, and the low resistance layer 3. The covering layer 6 is elastically deformable.

[Method of Producing Bending Sensor]

A method of producing the bending sensor 1 of the present embodiment is described below. The method of producing the bending sensor 1 of the present embodiment includes a coating preparation process, a printing process, a curing process, and a crack forming process.

(Coating Preparation Process)

In the coating preparation process, a coating material for the high resistance layer, a coating material for the low resistance layer, a coating material for the electrode portions, a coating material for the insulating layer, and a coating material for the covering layer are each prepared.

(Printing Process)

In the printing process, each layer is printed with a screen printer. First, the coating material for the electrode portions is printed on the upper surface of the base material 7. Then, the coating material for the high resistance layer is printed over the coating material for the electrode portions on the upper surface of the base material 7. Subsequently, the coating material for the insulating layer is printed over the coating material for the high resistance layer. Thereafter, the coating material for the low resistance layer is printed over the coating material for the insulating layer. Finally, the coating material for the covering layer is printed over the coating material for the low resistance layer. Thereby, the coating material for the electrode portions, the coating material for the high resistance layer, the coating material for the insulating layer, the coating material for the low resistance layer, and the coating material for the covering layer are painted in layers on the upper surface of the base material 7.

(Curing Process)

In the curing process, the base material 7 on which each layer is printed is rested in a drying oven so as to be cured.

(Crack Forming Process)

Figure 4:
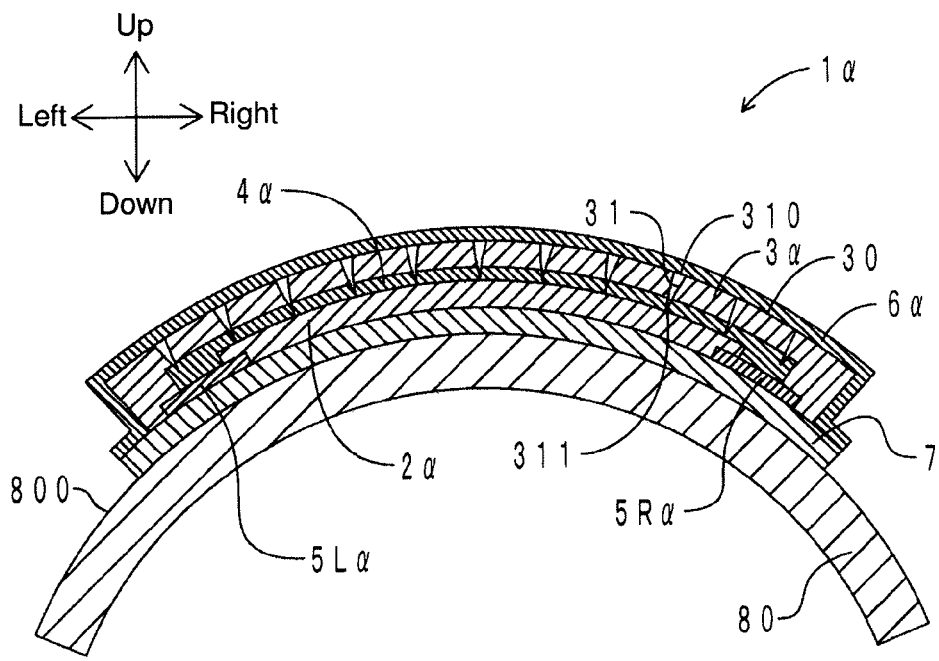
FIG. 4 is a schematic view illustrating a crack forming process in a method of producing the bending sensor.

FIG. 4 is a schematic view illustrating the crack forming process in the method of producing the bending sensor according to the present embodiment. With reference to FIG. 4, a crack forming mold 80 has a mold surface 800. A sensor precursor 1α has the base material 7, a coating material for electrode portions 5Lα and 5Rα, a coating material for a high resistance layer 2α, a coating material for an insulating layer 4α, a coating material for a low resistance layer 3α, and a coating material for a covering layer 6α.

The mold surface 800 has a curved surface projecting upward. In contrast, the base material 7 has a flat plate shape. Thus, when a lower surface of the base material 7 is pressed against the mold surface 800, the base material 7 bends along the mold surface. The coating material for the high resistance layer 2α, the coating material for the insulating layer 4α, and the coating material for the low resistance layer 3α are laminated in this sequence from an interior toward an exterior in a curvature radius direction. Thus, a tensile stress exerted on an outer peripheral surface of each layer is increased in the sequence of the coating material for the high resistance layer 2α, the coating material for the insulating layer 4α, and the coating material for the low resistance layer 3α due to the difference in the curvature radius. Accordingly, the cracks 31 are formed selectively in the coating material for the low resistance layer 3α and the coating material for the insulating layer 4α alone. Specifically, no cracks 31 are formed in the coating material for the high resistance layer 2α.

[Operations of Bending Sensor]

Operations of the bending sensor 1 of the present embodiment are described below. The bending sensor of the present embodiment can determine an OFF state and an ON state.

Figure 5:
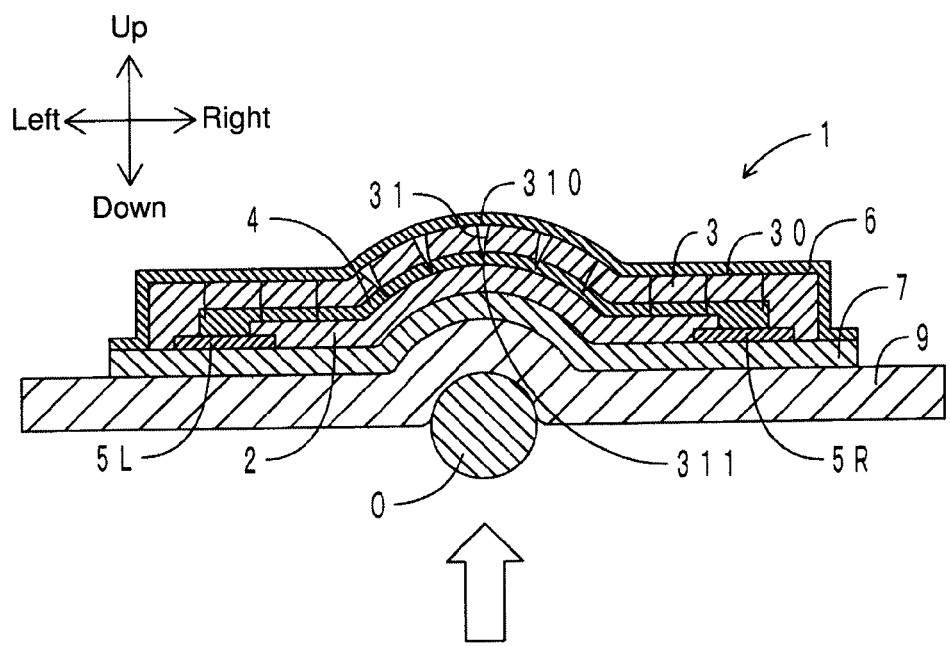
FIG. 5 is a cross-sectional view in a left-right direction of the bending sensor in an ON state.
Figure 6:
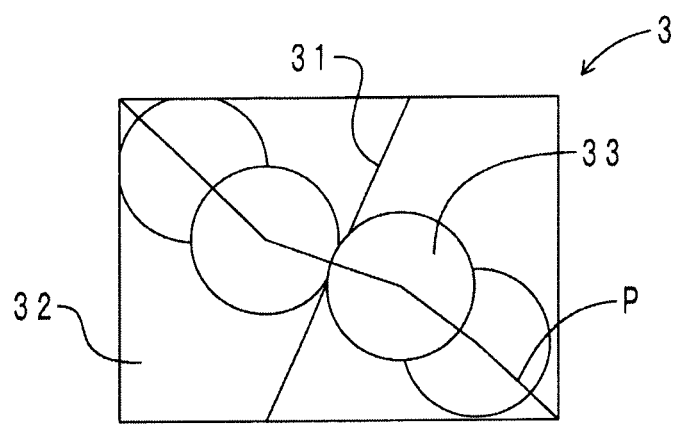
FIG. 6(a) is a schematic view of a low resistance layer of the bending sensor in an OFF state.
FIG. 6(b) is a schematic view of the low resistance layer in an ON state.
Figure 6:
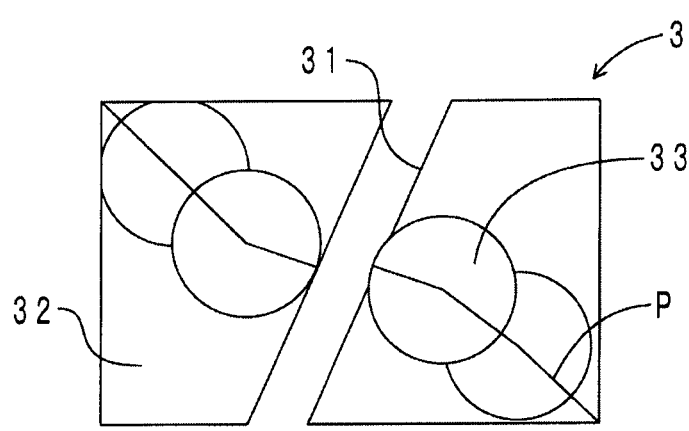
Figure 7:
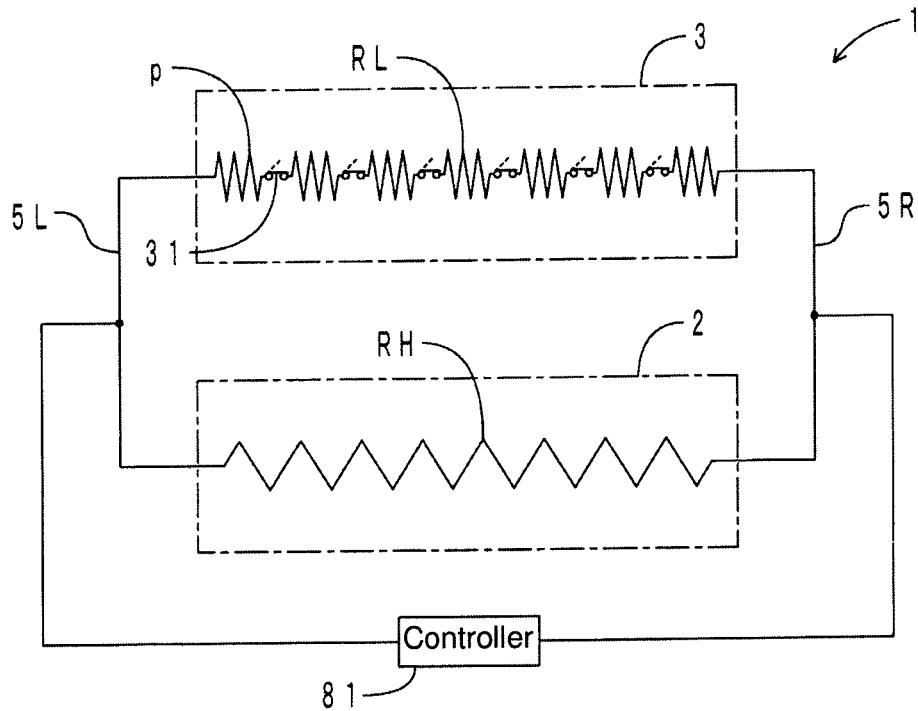
FIG. 7 is a schematic circuit diagram of the bending sensor.

FIG. 5 is a cross-sectional view in the left-right direction of the bending sensor of the present embodiment in the ON state. FIG. 5 corresponds to FIG. 2. FIG. 6(a) is a schematic view of the low resistance layer of the bending sensor in the OFF state. FIG. 6(b) is a schematic view of the low resistance layer in the ON state. FIG. 7 is a schematic circuit diagram of the bending sensor. With reference to FIG. 7, the high resistance layer 2 and the low resistance layer 3 are electrically connected in parallel to the electrode portions 5L and 5R.

(OFF State)

In the OFF state, the bending sensor 1 has a band shape extending in the left-right direction as shown in FIG. 2. The bending sensor 1 is not bent vertically. The cracks 31 in the low resistance layer 3 are closed, as shown in FIG. 3. Thus, the carbon beads 33 in the epoxy resin 32 are connected with one another and a conductive path P is formed in the left-right direction, as shown in FIG. 6(a). Specifically, with reference to FIG. 7, a plurality of divided bodies of the conductive path p which are adjacently disposed in the left-right direction is connected through the closed cracks 31. Accordingly, a combined resistance of an electrical resistance RH of the high resistance layer 2 and an electrical resistance RL of the low resistance layer 3 is supplied to a controller 81 as an OFF resistance Roff.

(On State)

With reference to FIG. 5, a colliding object O is collided with the bending sensor 1 from below, and then the bending sensor 1 is bent so as to project upward. Thus, the bending sensor 1 switches from the OFF state to the ON state.

In the ON state, a tensile stress is exerted on the tensile surface 30 of the low resistance layer 3. Thus, the cracks 31 open as shown in FIG. 6(b). Accordingly, the carbon beads 33 are disengaged from one another and the conductive path P is disconnected. Specifically, with reference to FIG. 7, the plurality of divided bodies of the conductive path p adjacently disposed in the left-right direction is disconnected by the opened cracks 31 (indicated with dotted lines). Thus, the electrical resistance RH of the high resistance layer 2 is supplied to the controller 81 as an ON resistance Ron. A threshold value Rth is defined between the OFF resistance Roff and the ON resistance Ron. The controller 81 compares the supplied electrical resistance with the threshold value Rth, and then determines the OFF state Soff and the ON state Son.

[Functions and Effects]

Figure 8:
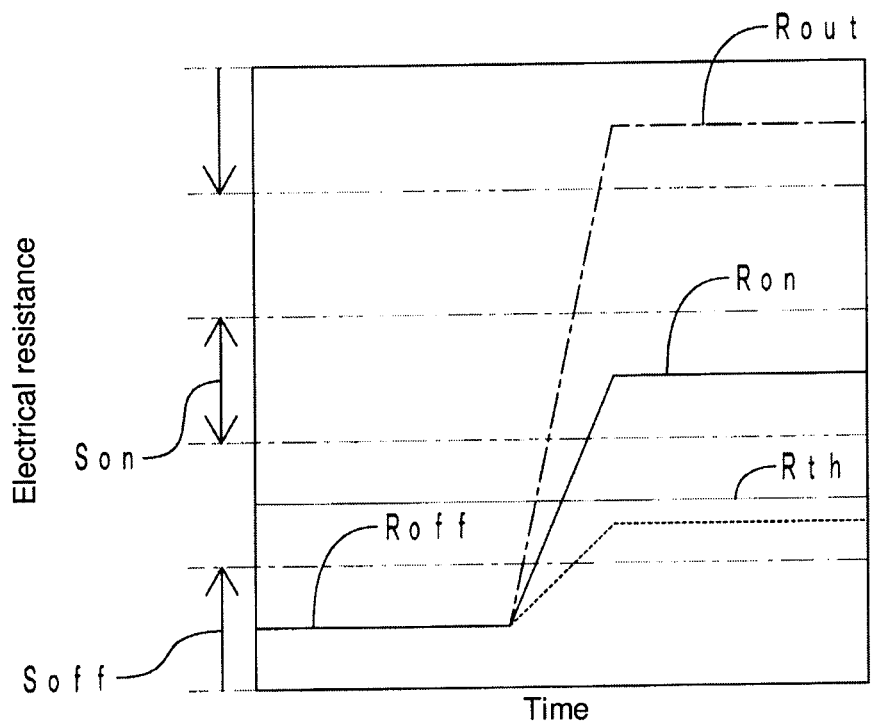
FIG. 8 is a schematic view illustrating a variation in electrical resistance of the bending sensor in the ON and OFF states.

Functions and effects of the bending sensor 1 of the present embodiment are described below. FIG. 8 is a schematic view illustrating a variation in electrical resistance of the bending sensor of the present embodiment in the ON and OFF states. With reference to FIG. 8, the OFF resistance Roff and the ON resistance Ron are significantly different from each other. Thus, the controller 81 can reliably determine the OFF state Soff and the ON state Son from the threshold value Rth.

In a case where a bending sensor has only a resistance layer without cracks, sensitivity (=variation amount in electrical resistance/deformation amount) is reduced, as indicated with a dotted line in FIG. 8. Thus, it is difficult to determine the OFF state Soff and the ON state Son. In contrast, in the case of the bending sensor 1 of the present embodiment, the cracks 31 open in the low resistance layer 3 without waiting for the epoxy resin 32 to deform, and then the conductive path P is disconnected. Thus, the sensitivity is increased.

Furthermore, in a case where an electrical resistance Rout output from the bending sensor 1 when a load is supplied is greater than the ON resistance Ron, as indicated with a dashed-dotted line in FIG. 8, the controller 81 can determine that the bending sensor 1 (specifically, the high resistance layer 2) is disconnected. Thus, the controller 81 can self-diagnose disconnection.

While the cracks 31 are disposed in the low resistance layer 3, no cracks 31 are disposed in the high resistance layer 2. Thus, the high resistance layer 2 is less variable in electrical resistance and sensitivity than the low resistance layer 3.

In this regard, the low resistance layer 3 and the high resistance layer 2 are electrically connected in parallel in the bending sensor 1 according to the present embodiment. Specifically, both the OFF resistance Roff and the ON resistance Ron output from the bending sensor 1 include the electrical resistance of the high resistance layer 2. Thus, a variation in the electrical resistance RL associated with a state of the cracks 31 in the low resistance layer 3 is unlikely to be reflected in the OFF resistance Roff and the ON resistance Ron. Compared with a bending sensor having only a resistance layer with cracks, the OFF resistance Roff and the ON resistance Ron are less likely to vary. In addition, the sensitivity is less likely to vary among a plurality of bending sensors 1. Thus, there is no need to adjust variation in sensitivity at activation of the bending sensor 1.

The cracks 31 pass through the low resistance layer 3 in the laminating direction and reach the insulating layer 4. Furthermore, the cracks 31 disconnect the low resistance layer 3 in the front-rear direction. In switching from the OFF state Soff to the ON state Son, at least one crack 31 of the numerous cracks 31 opens and thus completely electrically disconnects the low resistance layer 3. Accordingly, only the electrical resistance RH of the high resistance layer 2 is provided as the ON resistance Ron, thus making the difference greater between the OFF resistance Roff and the ON resistance Ron. This makes it easy to determine the OFF state Soff and the ON state Son. Furthermore, the sensitivity is less likely to vary among a plurality of bending sensors 1.

The OFF resistance Roff is the combined resistance of the electrical resistance RH of the high resistance layer 2 and the electrical resistance RL of the low resistance layer 3. The ON resistance Ron is the electrical resistance RH of the high resistance layer 2. Thus, each of the OFF resistance Roff and the ON resistance Ron is unlikely to vary. This makes it easy to determine the OFF state Soff and the ON state Son.

With any one of the cracks 31 opening, the bending sensor 1 of the present embodiment switches the OFF resistance Roff to the ON resistance Ron. Thus, regardless of a deformation state or a pressure receiving area of the bending sensor 1, the OFF state Soff and the ON state Son can be determined.

In the bending sensor 1 of the present embodiment, the high resistance layer 2 and the low resistance layer 3 are laminated on the base material 7. Thus, in switching from the OFF state Soff to the ON state Son, the high resistance layer 2 and the low resistance layer 3 are likely to be induced to bend and deform.

In the bending sensor 1 of the present embodiment, the tensile surface 30 of the low resistance layer 3 is covered by the covering layer 6. This inhibits degradation of the low resistance layer 3. Furthermore, the covering layer 6 is elastically deformable. Thus, in switching from the ON state Son to the OFF state Soff, the low resistance layer 3 is readily restored to its original shape by an elastic restoration force of the covering layer 6. The opened cracks 31 are also easily closed.

The pair of electrode portions 5L and 5R, the high resistance layer 2, the insulating layer 4, the low resistance layer 3, and the covering layer 6 are laminated and printed on the base material 7 by the screen printer. This readily reduces the thickness of each layer, thus reducing the thickness of the bending sensor 1 and enhancing dimension accuracy of each layer.

In the bending sensor 1 of the present embodiment, the conductive path P is disconnected mainly because the cracks 31 open. Compared with a case where a conductive path is disconnected solely depending on elastic deformation of the epoxy resin 32, a minor strain can also be detected accurately.

A rate of elastic deformation of the epoxy resin 32 is affected by ambient temperature. In this regard, the conductive path of the bending sensor 1 of the present embodiment is disconnected mainly because the cracks 31 open. Compared with the case where the conductive path P is disconnected solely depending on elastic deformation of the epoxy resin 32, a response speed relies less on ambient temperature.

The high resistance layer 2 and the low resistance layer 3 are laminated on the upper surface of the base material 7. The sensitivity of the bending sensor 1 can be adjusted by adjusting the vertical thickness of the base material 7. For instance, increasing the vertical thickness of the base material 7 increases deformation amounts of the high resistance layer 2 and the low resistance layer 3 in the ON state Son. This enhances the sensitivity of the bending sensor 1.

The cracks 31 are formed in advance in the low resistance layer 3 during production. Thus, new cracks 31 are unlikely to be formed during bending deformation. Accordingly, the sensitivity is unlikely to vary in the bending sensor 1.

The carbon beads 33 are dispersed in the epoxy resin 32 of the bending sensor 1 of the present embodiment. Thus, the cracks 31 are likely to be formed along surfaces of the carbon beads 33. Furthermore, the cracks 31 are likely to develop along the surfaces of the carbon beads 33, thus reducing a breaking strain of the low resistance layer 3. In addition, the number of the conductive paths P is less likely to decline in the OFF state Soff. In switching from the OFF state Soff to the ON state Son, a contact state of the carbon beads 33 is likely to change. The thickness of the low resistance layer 3 is readily reduced.

The carbon beads 33 have a spherical shape. This allows the carbon beads 33 to be mixed in the epoxy resin 32 at approximately the most tightly filled state. Thus, the three-dimensional conductive path P is likely to be formed and desired conductivity is likely to be exhibited. In response to elastic deformation of the low resistance layer 3, the contact state of the carbon beads 33 is readily changed. This increases a variation in electrical resistance between the OFF state Soff and the ON state Son. Furthermore, the carbon beads 33 have a limited number of functional groups in surfaces thereof. Thus, breaking is likely to occur in an interface between the carbon beads 33 and the epoxy resin 32, and thus the cracks 31 are likely to be formed in the low resistance layer 3.

In the bending sensor 1 of the present embodiment, approximately two cracks 31 are formed in each of the unit sections U, each unit section U having a length of 1 mm and extending in the left-right direction of the low resistance layer 3, as shown in FIG. 3. Thus, the bending sensor 1 has high sensitivity. Silica spherical particles are dispersed in the insulating layer 4 as the insulation filler. Thus, the cracks 31 are likely to be formed in the insulating layer 4 and the low resistance layer 3.

Second Embodiment

Figure 9:
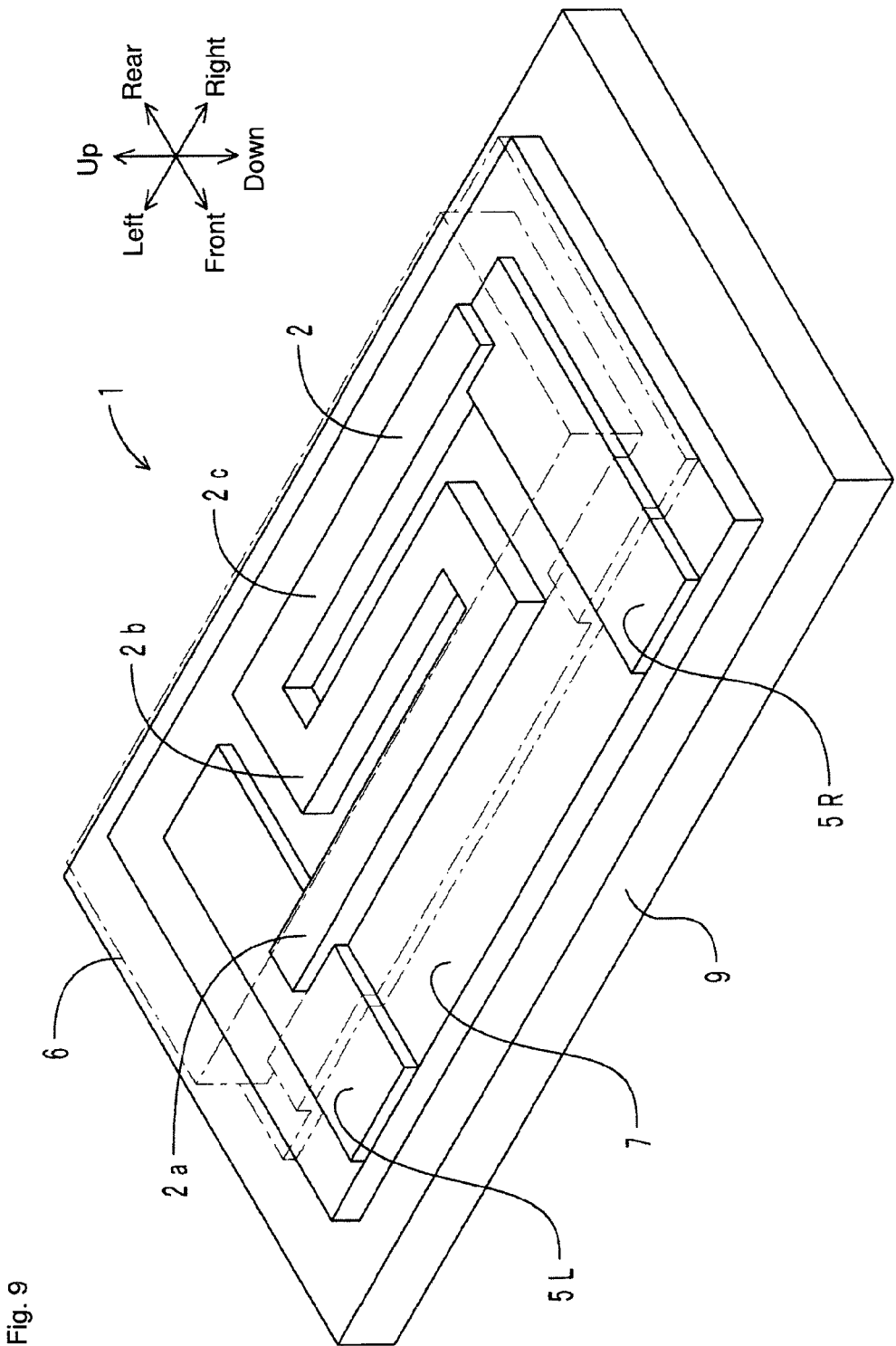
FIG. 9 is a transparent perspective view of a bending sensor according to a second embodiment.

A bending sensor according to the present embodiment is different from the bending sensor of the first embodiment only in a shape of a high resistance layer. Only the difference is described herein. FIG. 9 is a transparent perspective view of the bending sensor according to the present embodiment. Components corresponding to those in FIG. 1 are denoted with the same reference numerals.

With reference to FIG. 9, a high resistance layer 2 of a bending sensor 1 is disposed in an S shape between a pair of electrode portions 5L and 5R. Specifically, the high resistance layer 2 has a front portion 2a, a central portion 2b, and a rear portion 2c, which are continuous and formed into an S shape. The front portion 2a, the central portion 2b, and the rear portion 2c each extend in the left-right direction. A left end of the front portion 2a is connected to the electrode portion 5L. A right end of the rear portion 2c is connected to the electrode portion 5R.

With reference to FIG. 1, a length of a low resistance layer 3 in the front-rear direction is equivalent to a length from a front edge of the front portion 2a to a rear edge of the rear portion 2c. Thus, in a comparison of cross-sectional areas in a direction orthogonal to the left-right direction (specifically, surface direction that develops upward, downward, forward, and rearward), the left-right direction being a placement direction of the pair of electrode portions 5L and 5R, the cross-sectional area of the high resistance layer 2 is smaller than that of the low resistance layer 3.

The bending sensor 1 of the present embodiment has functions and effects similar to those of the bending sensor of the first embodiment with respect to components having common configurations. According to the bending sensor of the present embodiment, the cross-sectional area is reduced in the direction orthogonal to the placement direction of the pair of electrode portions 5L and 5R, and thus the electrical resistance of the high resistance layer 2 is greater than the electrical resistance of the low resistance layer 3. In addition, the actual length in the left-right direction of the high resistance layer 2 is extended, and thus the electrical resistance of the high resistance layer 2 is greater than the electrical resistance of the low resistance layer 3. A print pattern may be devised as in the bending sensor 1 of the present embodiment so as to provide a difference in the electrical resistance between the high resistance layer 2 and the low resistance layer 3.

Third Embodiment

Figure 10:
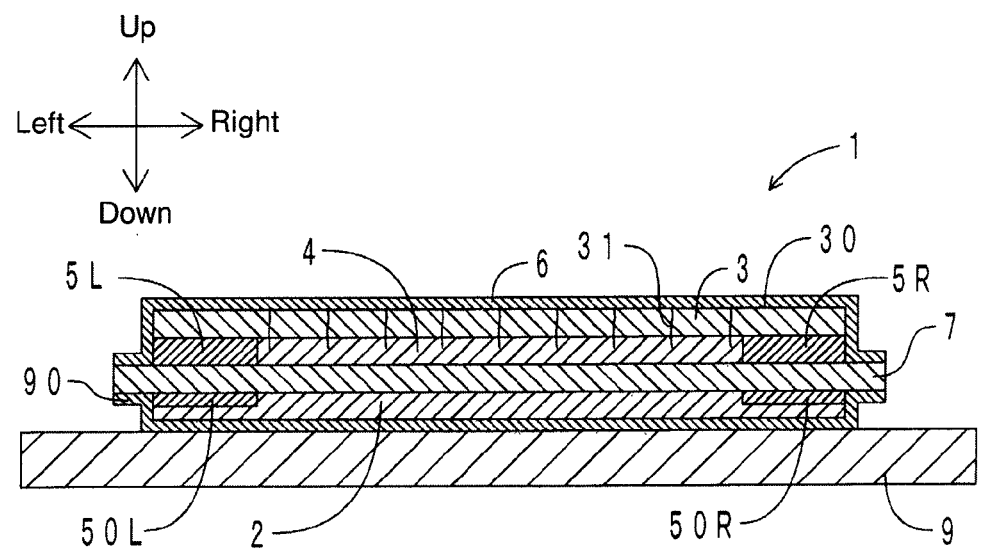
FIG. 10 is a cross-sectional view in a left-right direction of a bending sensor according to a third embodiment.

A bending sensor according to the present embodiment is different from the bending sensor of the first embodiment in that a high resistance layer is disposed on a surface on a load input side of a base material. Only the difference is described herein. FIG. 10 is a cross-sectional view in the left-right direction of the bending sensor according to the present embodiment. Components corresponding to those in FIG. 2 are denoted with the same reference numerals.

With reference to FIG. 10, a high resistance layer 2 is printed on a lower surface of a base material 7. The base material 7 is included in a concept of a "reinforcement layer" of the present invention. A pair of electrode portions 50L and 50R is disposed at each of a left and right end (each longitudinal end) of the high resistance layer 2. The high resistance layer 2 and the pair of electrode portions 50L and 50R are covered by a covering layer 90 from below. On an upper surface of the base material 7, an insulating layer 4, a pair of electrode portions 5L and 5R, and a low resistance layer 3 are printed and laminated. The layers are covered by a covering layer 6 from above. The electrode portion 50L and the electrode portion 5L have the same potential and are electrically connected. The electrode portion 50R and the electrode portion 5R have the same potential and are electrically connected.

The bending sensor 1 of the present embodiment has functions and effects similar to those of the bending sensor of the first embodiment with respect to components having common configurations. According to the bending sensor 1 of the present embodiment, the low resistance layer 3 and the insulating layer 4 are disposed separately from the high resistance layer 2 with the base material 7 therebetween. The base material 7 blocks cracks 31 from developing. Thus, the base material 7 can inhibit the cracks 31 from passing through the base material 7 and entering the high resistance layer 2.

Fourth Embodiment

Figure 11:
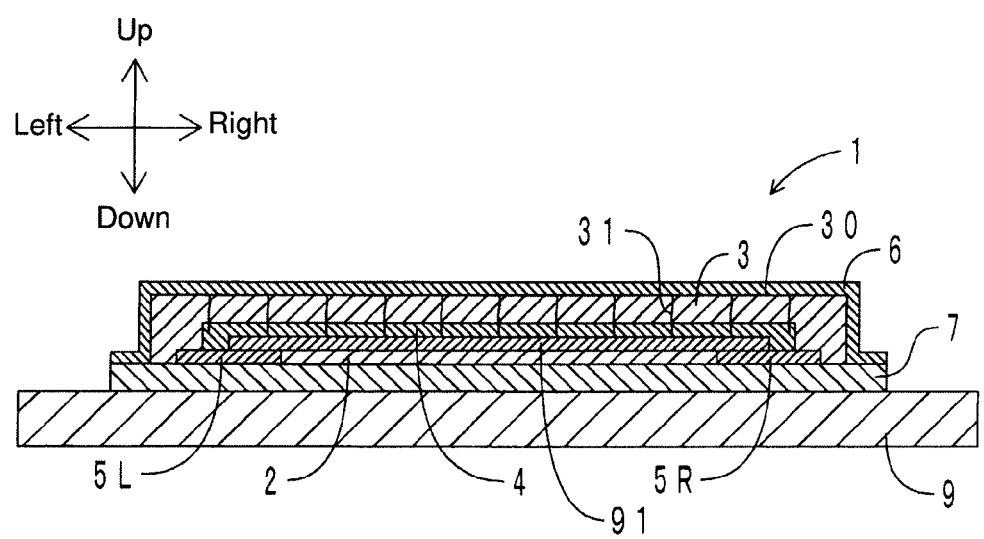
FIG. 11 is a cross-sectional view in a left-right direction of a bending sensor according to a fourth embodiment.

A bending sensor according to the present embodiment is different from the bending sensor of the first embodiment in that a reinforcement layer is provided between a high resistance layer and an insulating layer. Only the difference is described herein. FIG. 11 is a cross-sectional view in the left-right direction of the bending sensor according to the present embodiment. Components corresponding to those in FIG. 2 are denoted with the same reference numerals.

With reference to FIG. 11, a reinforcement layer 91 is provided between a high resistance layer 2 and an insulating layer 4. The reinforcement layer 91 is composed of an acrylic rubber. The reinforcement layer 91 has a lower Young's modulus than the insulating layer 4.

The bending sensor 1 of the present embodiment has functions and effects similar to those of the bending sensor of the first embodiment with respect to components having common configurations. According to the bending sensor 1 of the present embodiment, cracks 31 are unlikely to enter the reinforcement layer 91. Thus, the cracks 31 are inhibited from entering the high resistance layer 2.

Fifth Embodiment

Figure 12:
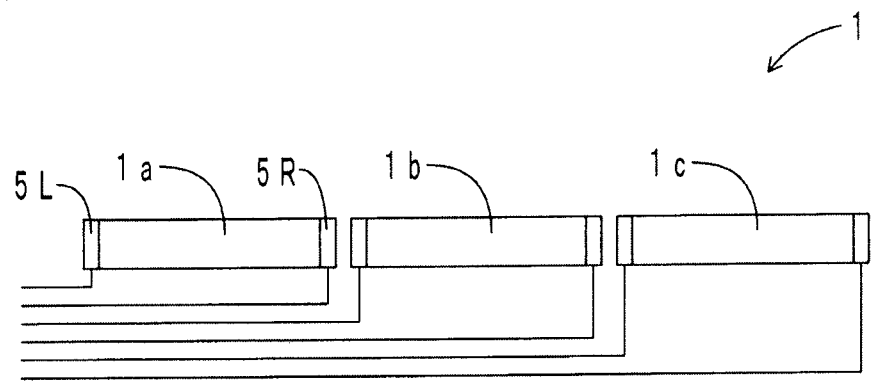
FIG. 12(a) is a schematic view illustrating a case where three divided bodies of a sensor are disposed linearly in a bending sensor according to a fifth embodiment.
FIG. 12(b) is a schematic view illustrating a case where the three divided bodies of the sensor are disposed in a curved shape in the bending sensor.
Figure 12:
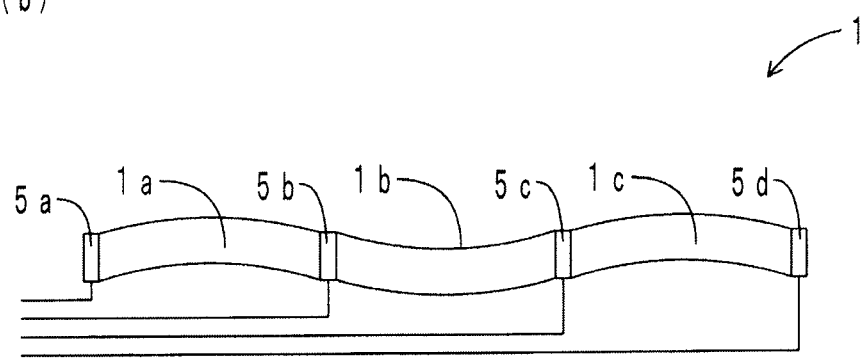

A bending sensor according to the present embodiment is different from the bending sensor of the first embodiment in that three divided bodies of a sensor are linearly disposed. Only the difference is described herein. FIG. 12(a) is a schematic view illustrating a case where three divided bodies of a sensor are disposed in a straight line in a bending sensor according to the present embodiment. FIG. 12(b) is a schematic view illustrating a case where the three divided bodies of the sensor are disposed in a curved line shape in the bending sensor. Components corresponding to those in FIG. 2 are denoted with the same reference numerals.

With reference to FIG. 12(a), a bending sensor 1 has three divided bodies 1a to 1c of a sensor. The divided bodies 1a to 1c of the sensor are disposed in a straight line. Furthermore, the divided bodies 1a to 1c of the sensor are disposed apart at predetermined intervals. Specifically, the divided bodies 1a to 1c of the sensor are aligned in a dotted line shape.

Configurations of the divided bodies 1a to 1c of the sensor are similar to that of the bending sensor 1 shown in FIG. 2. Specifically, the divided bodies 1a to 1c of the sensor each include a divided body of a high resistance layer (corresponding to the high resistance layer 2 in FIG. 2), a divided body of a low resistance layer (corresponding to the low resistance layer 3 in FIG. 2), a divided body of an insulating layer (corresponding to the insulating layer 4 in FIG. 2), a divided body of a covering layer (corresponding to the covering layer 6 in FIG. 2), and a divided body of a base material (corresponding to the base material 7 in FIG. 2).

A pair of electrode portions 5L and 5R is disposed so as to have one at each longitudinal end of each of the divided bodies 1a to 1c of the sensor. The electrode portion 5L is electrically connected to one longitudinal end of the divided body of the high resistance layer and to one longitudinal end of the divided body of the low resistance layer. The electrode portion 5R is electrically connected to the other longitudinal end of the divided body of the high resistance layer and to the other longitudinal end of the divided body of the low resistance layer.

With reference to FIG. 12(b), the bending sensor 1 has three divided bodies 1a to 1c of a sensor. The divided bodies 1a to 1c of the sensor are disposed in a curved line shape. Furthermore, the divided bodies 1a to 1c of the sensor are disposed consecutively. Specifically, the divided bodies 1a to 1c of the sensor are connected in a solid line shape.

Configurations of the divided bodies 1a to 1c of the sensor are similar to that of the bending sensor 1 shown in FIG. 2 (similar to FIG. 12(a)). The divided bodies 1a to 1c of the sensor each have a curved shape. The bending sensor 1 of FIG. 12(b) includes an electrode portion 5a, the divided body 1a of the sensor, an electrode portion 5b, the divided body 1b of the sensor, an electrode portion 5c, the divided body 1c of the sensor, and an electrode portion 5d, which are aligned in the longitudinal direction. Specifically, the electrode portions 5a to 5d and the divided bodies of the sensor 1a to 1c alternate adjacently.

A curvature direction of the divided bodies 1a and 1c of the sensor and a curvature direction of the divided body 1b of the sensor are opposite to each other. The electrode portion 5b of FIG. 12(b) serves both as the electrode portion 5R for the divided body 1a of the sensor and the electrode portion 5L for the divided body 1b of the sensor. The electrode portion 5c of FIG. 12(b) serves both as the electrode portion 5R for the divided body 1b of the sensor and the electrode portion 5L for the divided body 1c of the sensor.

The bending sensor 1 of the present embodiment has functions and effects similar to those of the bending sensor of the first embodiment with respect to components having common configurations. According to the bending sensor 1 of the present embodiment, the bending sensor 1 is readily disposed in a desired portion of a mounted member.

In addition, the bending sensor 1 of the present embodiment reduces a measurement error attributable to specific resistance of the divided body of the high resistance layer and the divided body of the low resistance layer. Thus, even a small deformation can be detected accurately.

In the bending sensor 1 of the present embodiment, the combined resistance of the electrical resistance of the divided body of the high resistance layer and the electrical resistance of the divided body of the low resistance layer is defined at 10 kΩ or less in any divided bodies 1a to 1c of the sensor in the OFF state. In this regard as well, the bending sensor 1 of the present embodiment can accurately detect a small deformation.

Sixth Embodiment

A bending sensor according to the present embodiment is different from the bending sensor of the first embodiment in that a low resistance layer and a high resistance layer are adjacently disposed on a surface on a load output side of a base material. Only the difference is described herein.

Figure 13:
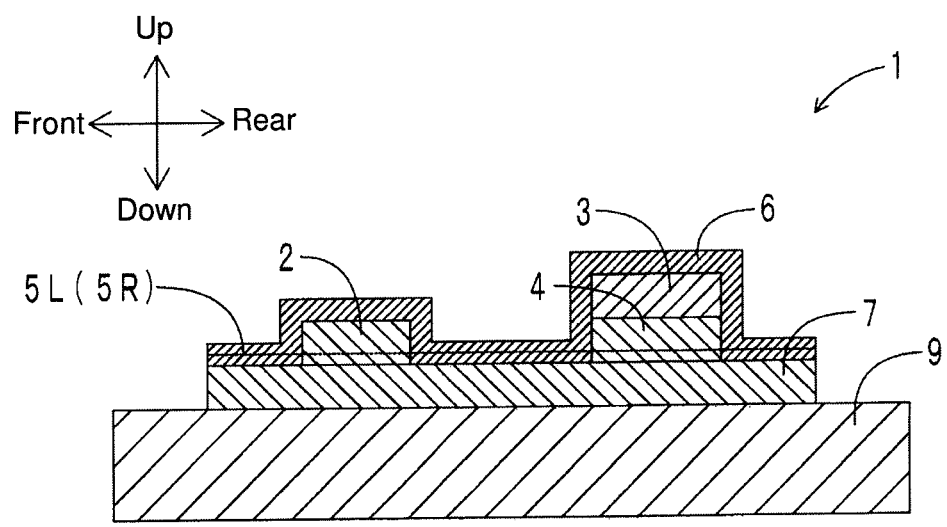
FIG. 13 is a cross-sectional view in a front-rear direction of a bending sensor according to a sixth embodiment.

FIG. 13 is a cross-sectional view in the front-rear direction of the bending sensor according to the present embodiment. Components corresponding to those in FIG. 2 are denoted with the same reference numerals. With reference to FIG. 13, a high resistance layer 2 is printed in a front portion of an upper surface of a base material 7. An insulating layer 4 and a low resistance layer 3 are laminated and printed in a rear portion of the upper surface of the base material 7. As indicated with a dotted line in FIG. 13, a left and right pair of electrode portions 5L and 5R is printed on the upper surface of the base material 7. The electrode portion 5L electrically connects a left end of the high resistance layer 2 and a left end of the low resistance layer 3. The electrode portion 5R electrically connects a right end of the high resistance layer 2 and a right end of the low resistance layer 3. A covering layer 6 covers the high resistance layer 2, the low resistance layer 3, the insulating layer 4, and the pair of electrodes 5L and 5R from above.

The bending sensor 1 of the present embodiment has functions and effects similar to those of the bending sensor of the first embodiment with respect to components having common configurations. According to the bending sensor 1 of the present embodiment, the high resistance layer 2 and the low resistance layer 3 do not overlap as viewed from above (load output side) or below (load input side). In other words, the high resistance layer 2 and the low resistance layer 3 are not adjacently provided in a development direction of cracks. Thus, the cracks are inhibited from entering the high resistance layer 2.

<Miscellaneous>

The embodiments of the bending sensor of the present invention were described above. The present invention, however, is not particularly limited to the embodiments above. The present invention may be embodied in various modifications and improvements that persons skilled in the art would perform.

In the first embodiment, the shape of the conductive filler relative to the epoxy resin 32 makes a difference in electrical resistance between the high resistance layer 2 and the low resistance layer 3. The material or filling rate of the conductive filler, however, may be used to create a difference in the electrical resistance between the high resistance layer 2 and the low resistance layer 3. Alternatively, volume resistivity of the high resistance layer 2 and the low resistance layer 3 may be adjusted by another method to create a difference in the electrical resistance between the high resistance layer 2 and the low resistance layer 3.

In the second embodiment, the cross-sectional area orthogonal to the placement direction of the pair of electrode portions 5L and 5R is reduced by reducing the total length in the front-rear direction of the high resistance layer 2. The cross-sectional area, however, may be reduced by reducing the vertical thickness of the high resistance layer 2. Alternatively, the high resistance layer 2 may be folded and disposed redundantly to increase the actual length of the high resistance layer 2.

In the first embodiment and the second embodiment, the electrode portions 5L and 5R, the high resistance layer 2, the insulating layer 4, the low resistance layer 3, and the covering layer 6 are laminated and printed on the upper surface of the base material 7. However, a method of forming the layers is not limited to a printing method. For instance, a dip method, a spray method, or a bar-coating method may be employed as a method of forming from a coating material. Alternatively, the layers above may be prepared separately, not formed from the coating material, and be attached to the base material 7. For instance, each of the layers may be press-molded with a mold and pasted to one another. In the fifth embodiment, the three divided bodies 1a to 1c of the sensor are disposed, but the number of the divided bodies 1a to 1c of the sensor to be disposed is not particularly limited.

In the embodiments above, silica spherical particles are dispersed as the insulation filler in the insulating layer 4. It is unnecessary, however, to disperse the insulation filler. In the embodiments above, the ends 311 of the cracks 31 reach the interior of the insulating layer 4. It is unnecessary, however, that the ends 311 reach the insulating layer 4.

With reference to FIG. 4, the curvature radius of the mold surface 800 of the crack forming mold 80 may be decreased to increase the density of the cracks 31. This forms numerous cracks 31 in the low resistance layer 3. The number of the cracks 31 to be disposed is not particularly limited. A single crack or a plurality of cracks may be provided.

Materials for the covering layers 6 and 90 are not particularly limited, provided the materials are insulating material. The covering layers 6 and 90 may be eliminated. The number and locations of the electrode portions 5L and 5R may be determined as desired. For example, three or more electrode portions 5L and 5R may be disposed at equal intervals and electrical resistance may be measured between an adjacent pair of electrode portions 5L and 5R.

A material for the reinforcement layer 91 is not particularly limited. For example, the material may be the same as those for the covering layers 6 and 90. A gap may be provided as the reinforcement layer 91. Specifically, a spacer may be disposed between the insulating layer 4 and the high resistance layer 2. In other words, the reinforcement layer 91 should inhibit the cracks 31 from developing further. Alternatively, the reinforcement layer 91 and the insulating layer 4 may be integrally provided. For example, a functionally graded layer may be disposed that includes a filler to increase brittleness of a material, including more filler in the insulating layer 4 side than in the reinforcement layer 91 side.

The base material 7 should restrict elastic deformation of one surface of the high resistance layer 2. In addition to PI in the embodiments above, a flexible resin film is preferred, such as polyethylene (PE), polyethylene terephthalate (PET), and polyethylene naphthalate (PEN). The thickness of the base material 7 is preferably, for example, 10 μm or greater and 500 μm or less.

Shapes and sizes of the high resistance layer 2, the low resistance layer 3, and the insulating layer 4 are not particularly limited. They may be determined so as to be suitable for a purpose of the bending sensor 1. The high resistance layer 2, the low resistance layer 3, and the insulating layer 4 preferably have a thickness of 10 μm or greater and 500 μm or less in view of reduction in size and thickness of the bending sensor 1, for instance. The thickness is more preferably 250 μm or less. Reducing the thickness of the high resistance layer 2, the low resistance layer 3, and the insulating layer 4 tends to allow the base material 7 to exercise an effect in inducing bending deformation Parent materials for the high resistance layer 2, the low resistance layer 3, and the insulating layer 4 may be selected appropriately from resins and elastomers with consideration of compatibility with a conductive filler and an insulation filler. In particular, in a case where the high resistance layer 2, the low resistance layer 3, and the insulating layer 4 are formed of a coating material for a high resistance layer, a coating material for a low resistance layer, and a coating material for an insulating layer, respectively, selecting a material that can be coated is desirable. Specifically, selecting a material that is itself a liquid or a material soluble in a solvent is preferred.

Examples of thermoplastic resins may include PE, polypropylene (PP), polyvinylchloride (PVC), polystyrene (PS), polyvinyl acetate (PVAc), polytetrafluoroethylene (PTFE), an acrylonitrile-butadiene styrene (ABS) resin, an acrylic resin, polyamide (PA), polyacetal (POM), polycarbonate (PC), polyphenylene oxide (PPO), PET, polybutylene terephthalate (PBT), an amorphous fluorine resin, an amorphous polyester resin, and a phenoxy resin. In particular, the polyamide, the amorphous fluorine resin, the amorphous polyester resin, and the phenoxy resin are preferred due to solubility in a solvent.

Examples of thermoset resins may include an epoxy resin, an alkyd resin, a phenol resin, a urea resin, a melamine resin, an unsaturated polyester resin, a polyurethane, and PI. In particular, the epoxy resin is preferred. A majority of epoxy resins are in a liquid form having a relatively low viscosity in a pre-cured condition. Thus, the epoxy resins can be a coating material without a solvent. In addition, the epoxy resins have good compatibility with a conductive filler and an insulation filler. This allows the conductive filler to be mixed in while in a substantially single particle state at a high filling rate. Examples of the epoxy resins may include a bisphenol-type epoxy resin (types A, F, and AD), an alicyclic epoxy resin, a novolac-type epoxy resin, and a polyglycidyl ether, which is produced in a reaction of polyalcohols and epichlorohydrin.

The elastomer may be selected appropriately from rubbers and thermoplastic elastomers. Examples of rubbers may include a natural rubber (NR), an isoprene rubber (IR), a butadiene rubber (BR), an acrylonitrile-butadiene copolymer rubber (NBR), a styrene-butadiene copolymer rubber (SBR), an ethylene-propylene copolymer rubber (an ethylene-propylene copolymer (EPM), an ethylene-propylene-diene terpolymer (EPDM), and the like), a butyl rubber (IIR), a halogenated butyl rubber (Cl-IIR, Br-IIR, and the like), a hydrogenated nitrile rubber (H-NBR), a chloroprene rubber (CR), an acrylic rubber (AR), a chlorosulfonated polyethylene rubber (CSM), a hydrin rubber, a silicone rubber, a fluorine-containing rubber, a urethane rubber, and a synthetic latex. Examples of thermoplastic elastomers may include various thermoplastic elastomers, including styrene, olefin, urethane, polyester, polyamide, and fluorine thermoplastic elastomers, and derivatives thereof. In particular, EPDM, NBR, and the silicone rubber, which have good compatibility with a conductive filler, are preferred. Furthermore, liquid IR, liquid BR, and an RTV-type (room-temperature curing type) silicone rubber, are preferred since they are in a liquid form before being cured and can be a coating material without using a solvent.

The conductive filler in the low resistance layer 3 is not particularly limited, provided it has conductivity. Examples of the conductive filler may include fine particles of carbon materials and metals, of which one type may be used alone or two or more types may be combined. For example, an aspect ratio of the conductive filler (ratio of a long side relative to a short side) is preferably in a range of 1 or greater and 2 or less. With an aspect ratio greater than 2, a one-dimensional conductive path P is likely to be formed due to a contact between conductive fillers. From the vantage of further approaching the most tightly filled state for a filling state of the conductive filler in the parent material, the conductive filler is preferably particles having a perfect spherical or extremely proximate to perfect spherical shape (substantially perfect spherical shape).

A preferred example of the conductive filler is carbon beads. The carbon beads have a good conductivity and are relatively affordable. With substantially a perfect spherical shape, the carbon beads can be mixed in at a high filling rate. Specifically, examples of the carbon beads may include meso-carbon micro beads manufactured by Osaka Gas Chemicals Co., Ltd. (MCMB6-28 (average particle size: approximately 6 μm), MCMB10-28 (average particle size: approximately 10 μm), and MCMB25-28 (average particle size: approximately 25 μm)); carbon micro beads manufactured by Nippon Carbon Co., Ltd., including Nicabeads® ICB, Nicabeads PC, Nicabeads MC, Nicabeads MSB (ICB0320 (average particle size: approximately 3 μm), ICB0520 (average particle size: approximately 5 μm), ICB 1020 (average particle size: approximately 10 μm), PC0720 (average particle size: approximately 7 μm), and MC0520 (average particle size: approximately 5 μm)); and carbon beads (average particle size: approximately 10 μm) manufactured by Nisshinbo.

The filling rate of the conductive filler is preferably 30 volume % or greater relative to a total volume of the low resistance layer 3 of 100 volume %. At less than 30 volume %, the conductive filler is difficult to mix in at a state proximate to the most tightly filled state, and thus desired conductivity is difficult to achieve. In addition, a variation in electrical resistance in response to elastic deformation of the low resistance layer 3 is slow, and thus controlling an increase in the electrical resistance is difficult. The filling rate is more preferably 35 volume % or greater. Conversely, the filling rate of the conductive filler is preferably 65 volume % or less relative to the total volume of the low resistance layer 3 of 100 volume %. At greater than 65 volume %, the low resistance layer 3 is difficult to elastically deform. In addition, mixing with the parent material becomes difficult, thus decreasing forming processability. Furthermore, preparing a coating material for the low resistance layer is difficult. The filling rate is more preferably 55 volume % or less.

The conductive filler is preferably present in the parent material in a state of primary particles with as little aggregation as possible. Thus, the average particle size and compatibility with the parent material should be considered in selection of the conductive filler. For example, the average particle size of the conductive filler present in the state of primary particles is preferably 0.05 μm or greater and 100 μm or less. At less than 0.05 μm, the conductive filler tends to aggregate and form secondary particles. The average particle size is preferably 0.5 μm or greater and is further preferably 1 μm or greater. Conversely, with an average particle size of greater than 100 μm, translational motion (parallel motion) of the conductive filler due to elastic deformation is relatively small relative to the average grain size and a variation in electrical resistance relative to elastic deformation is slow. Furthermore, reducing the thickness of the low resistance layer 3 is difficult. The average particle size is preferably 60 μm or less and is further preferably 30 μm or less.

The conductive filler in the high resistance layer 2 is not particularly limited, provided it has conductivity. Examples of the conductive filler may include fine particles of carbon materials and metals, of which one type may be used alone, or two or more types may be combined. For example, an aspect ratio of the conductive filler (ratio of a long side relative to a short side) is preferably 2 or greater. With an aspect ratio of 2 or more, a one-dimensional conductive path P is likely to be formed due to contact between conductive fillers. Thus, the conductive path P is unlikely to break even when stretched.

A preferred example of the conductive filler is a conductive carbon having a high structure. Specifically, examples of the conductive carbon may include Ketjenblack (EC300J (DBP oil absorption: 360 ml/100 g) and EC600JD (DBP oil absorption: 495 ml/100 g)) manufactured by Lion Corporation; VULCAN XC-72 (DBP oil absorption: 178 ml/100 g) manufactured by Cabot Corporation; BP-2000 (DBP oil absorption: 300 ml/100 g) manufactured by Cabot Corporation; #3950 (DBP oil absorption: 330 ml/100 g), #3050B (DBP oil absorption: 180 ml/100 g), and #4350 (DBP oil absorption: 171 ml/100 g) manufactured by Mitsubishi Chemical Corporation; HS-100 (DBP oil absorption: 150 ml/100 g) manufactured by Denki Kagaku Kogyo Kabushiki Kaisha; and TB #5500 (DBP oil absorption: 155 ml/100 g) manufactured by Tokai Carbon Co., Ltd.

The filling rate of the conductive filler is preferably 10 volume % or greater and 30 volume % or less relative to a total volume of the high resistance layer 2 of 100 volume %. At less than 10 volume %, the conductive path P is unlikely to be formed by the conductive filler, and thus desired conductivity is difficult to achieve. In addition, a variation in electrical resistance in response to elastic deformation of the high resistance layer 2 is slow, and thus controlling an increase in the electrical resistance is difficult. The filling rate is more preferably 15 volume % or greater. Conversely, the filling rate of the conductive filler is preferably 30 volume % or less relative to the total volume of the high resistance layer 2 of 100 volume %. At greater than 30 volume %, the high resistance layer 2 is difficult to elastically deform. In addition, mixing with the parent material is difficult, thus decreasing forming processability. Furthermore, preparing a coating material for the high resistance layer is difficult. The filling rate is more preferably 25 volume % or less.

The conductive filler preferably forms a high-order chain structure in the parent material as much as possible. Thus, the average particle size and compatibility with the parent material should be considered in selection of the conductive filler. For example, the average particle size of the conductive filler present in a state of primary particles is preferably 0.05 μm or less.

Thus, the conductive filler of the high resistance layer 2 preferably has a high structure and a high aspect ratio in order to inhibit the cracks 31 from occurring (in order to reduce a variation in resistance even when stretched to some extent). Furthermore, the conductive filler is preferably aggregated in the parent material in a secondary structure (chain). The filling rate is preferably 10 volume % or greater and 30 volume % or less relative to the total volume of the high resistance layer 2 of 100 volume % since the cracks 31 tend to develop at a high filling rate. The DBP oil absorption is preferably 100 ml/100 g or greater. The aspect ratio is preferably 2 or greater. Thus, the cracks 31 can be inhibited from occurring in the high resistance layer 2. Accordingly, an increase in resistance below the ON resistance Ron is not observed.

The insulation filler preferably has insulation properties and has a spherical shape to allow cracks to pass through. Examples of the insulation filler may include fine particles, such as spherical silica (FB-7SCD (average particle size: 5.8 μm), FB-5SCD (average particle size: 4.5 μm), and FB-3SCD (average particle size: 3.4 μm)) manufactured by Denki Kagaku Kogyo Kabushiki Kaisha; spherical aluminum nitride (FAN-f05 (average particle size: 6 μm)) manufactured by Furukawa Denshi Co., Ltd.; and spherical silica (SO-C6 (average particle size: 2.2 μm)) and spherical alumina (AO-520 (average particle size: 20 μm)) manufactured by Admatechs Co., Ltd. Of those, one type may be used alone, or two or more types may be combined.

The high resistance layer 2 and the low resistance layer 3 are produced as described below, for example. In a case where a thermoplastic resin is selected for the parent material, the conductive filler and additives, when necessary, are mixed into the heated and melted thermoplastic resin. Then, the mixture is press-molded, injection-molded, or the like. Thereafter, the cracks 31 are formed in the low resistance layer 3.

In a case where a thermoset resin is selected for the parent material, a curing agent and additives, when necessary, are mixed into a pre-curing resin, and then the mixture is press-molded or the like to be cured. Thereafter, the cracks 31 are formed in the low resistance layer 3.

In a case where an elastomer is selected for the parent material, additives such as a vulcanization aid and a softener are first added into the elastomer and then kneaded. Subsequently, the conductive filler is added and kneaded, and a cross-linker and a vulcanization promoter are further added and kneaded to produce an elastomer composition. Then, the elastomer composition is molded into a sheet shape and is filled into a mold to be press-vulcanized. Thereafter, the cracks 31 are formed in the low resistance layer 3.

The high resistance layer 2 and the low resistance layer 3 are preferably formed of a coating material for a high resistance layer and a coating material for a low resistance layer, respectively, to reduce the thickness thereof. Specifically, the coating material for the high resistance layer and the coating material for the low resistance layer are prepared, each of which contains a component for molding a parent material, such as a resin or an elastomer. Then, the prepared coating material for the high resistance layer and coating material for the low resistance layer are coated on the base material 7 and dried. In a case where a thermoset resin is used, the thermoset resin can be cured after the coating material for the high resistance layer and the coating material for the low resistance layer are coated. In a case where an elastomer is used, a cross-linking reaction can be promoted at the same time as drying or after drying.

Various methods may be employed for coating the coating material for the high resistance layer and the coating material for the low resistance layer. Examples may include printing methods, such as ink jet printing, flexography, gravure printing, screen printing, pad printing, and lithography; a dip method; a spray method; and a bar-coating method. Employing a printing method allows easy separation of a portion to be coated from a portion not to be coated, for example. Printing a large area, a fine line, and a complex shape, is also easy. In addition, the high resistance layer 2, the low resistance layer 3, the electrode portions 5L and 5R, and the insulating layer 4 can be formed in a similar method, thus allowing easy integration of the layers. Screen printing is suitable among the printing methods because it allows use of a high-viscosity coating material and easy control over thickness of a coating film. The bending sensor of the present invention can be used for detection of pinching in an open/close portion of a door or a window and detection of a vehicle collision.

What is claimed:
1. A bending sensor comprising:
  a high resistance layer comprising:
    a parent material composed of one of a resin and an elastomer; and
    a conductive filler dispersed in the parent material;
  a low resistance layer comprising:
    a parent material composed of one of a resin and an elastomer;
    a conductive filler dispersed in the parent material;
    a tensile surface receiving tensile stress during bending deformation; and
    a crack having an opening on the tensile surface and developing in a laminating direction,
  the low resistance layer having lower electrical resistance than the high resistance layer in a state where the crack is closed;
  an insulating layer comprising:
    at least the parent material from among a parent material composed of one of a resin and an elastomer, and an insulation filler dispersed in the parent material, the insulating layer being disposed between the high resistance layer and the low resistance layer and electrically insulating the high resistance layer from the low resistance layer; and a plurality of electrode portions connecting electrically in parallel the high resistance layer and the low resistance layer, wherein in an OFF state in which a bend amount is small, the crack is unlikely to open and a combined resistance of an electrical resistance of the high resistance layer and an electrical resistance of the low resistance layer is output as OFF resistance from the plurality of electrode portions, and in an ON state in which the bend amount is larger than the bend amount in the OFF state, the crack is more likely to open than in the OFF state, and, of the electrical resistance of the high resistance layer and the electrical resistance of the low resistance layer, at least the electrical resistance of the high resistance layer is output as ON resistance higher than the OFF resistance from the plurality of electrode portions.

2. The bending sensor according to claim 1, wherein the crack passes through the low resistance layer in the laminating direction and reaches the insulating layer.

3. The bending sensor according to claim 1, wherein the opening disconnects the tensile surface in a direction orthogonal to a placement direction of the plurality of electrode portions.

4. The bending sensor according to claim 1, wherein the insulating layer is laminated on a load output side of the high resistance layer and the low resistance layer is laminated on a load output side of the insulating layer, the bending sensor further comprising:

an elastically deformable covering layer disposed on the load output side of the low resistance layer and covering the opening; and a base material disposed on the load input side of the high resistance layer and having the high resistance layer fixed thereto.

5. The bending sensor according to claim 4, wherein the plurality of electrode portions, the high resistance layer, the insulating layer, the low resistance layer, and the covering layer are laminated and printed on the base material.

6. The bending sensor according to claim 1, further comprising:

a reinforcement layer provided between the high resistance layer and the insulating layer and inhibiting the crack from developing deeper than the insulating layer.

7. The bending sensor according to claim 6, wherein the reinforcement layer has the insulating layer and the low resistance layer laminated and printed on a surface of a load output side and has the high resistance layer printed on a surface of a load input side.

8. The bending sensor according to claim 1, wherein the high resistance layer and the low resistance layer are disposed so as not to overlap when viewed from one of the load input side and the load output side.

9. The bending sensor according to claim 1, wherein the high resistance layer has a cross-sectional area smaller than the low resistance layer in the direction orthogonal to the placement direction of the plurality of electrode portions.

10. The bending sensor according to claim 1, wherein the high resistance layer has higher volume resistivity than the low resistance layer.

11. The bending sensor according to claim 10, wherein a difference in the volume resistivity is created between the high resistance layer and the low resistance layer by adjusting filling rates of the conductive filler for the high resistance layer and the low resistance layer.

12. The bending sensor according to claim 1, further comprising:

a plurality of divided bodies of a sensor comprising:

a divided body of a high resistance layer as a portion of the high resistance layer;

a divided body of a low resistance layer as a portion of the low resistance layer;

a divided body of an insulating layer as a portion of the insulating layer; and the plurality of electrode portions connecting electrically in parallel the divided body of the high resistance layer and the divided body of the low resistance layer, wherein the plurality of divided bodies of the sensor is linearly disposed.

13. The bending sensor according to claim 12, wherein a combined resistance of an electrical resistance of the divided body of the high resistance layer and an electrical resistance of the divided body of the low resistance layer is 10 kΩ or less in any divided body of the sensor in the OFF state.

* * * * *